(12) United States Patent
Hirotsu et al.

(10) Patent No.: US 11,037,649 B2
(45) Date of Patent: Jun. 15, 2021

(54) TEST DEVICE AND TEST METHOD OF SEMICONDUCTOR STORAGE DEVICE

(71) Applicant: Winbond Electronics Corp., Taichung (TW)

(72) Inventors: Junichi Hirotsu, Kanagawa (JP); Daiki Ito, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/813,743

(22) Filed: Mar. 10, 2020

(65) Prior Publication Data

US 2020/0303032 A1    Sep. 24, 2020

(30) Foreign Application Priority Data

Mar. 19, 2019 (JP) .............................. JP2019-051018

(51) Int. Cl.
*G11C 29/50* (2006.01)
*G11C 29/46* (2006.01)
*G11C 7/10* (2006.01)
*G11C 11/4074* (2006.01)
*G11C 11/408* (2006.01)
*G11C 11/4094* (2006.01)

(52) U.S. Cl.
CPC .............. *G11C 29/50* (2013.01); *G11C 7/106* (2013.01); *G11C 7/1087* (2013.01); *G11C 11/4074* (2013.01); *G11C 11/4085* (2013.01); *G11C 11/4094* (2013.01); *G11C 29/46* (2013.01); *G11C 2029/5004* (2013.01)

(58) Field of Classification Search
CPC ...................................................... G11C 29/50
See application file for complete search history.

(56) References Cited

U.S. PATENT DOCUMENTS 4,320,507 A * 3/1982 Fukushima ............ G11C 29/52
714/721
5,687,178 A * 11/1997 Herr ....................... G11C 29/02
714/721

FOREIGN PATENT DOCUMENTS

JP            2011181142       9/2011

* cited by examiner

*Primary Examiner* — Douglas King
(74) *Attorney, Agent, or Firm* — JCIPRNET

(57) ABSTRACT

A test device capable of measuring characteristics of respective transistors constituting a memory cell is provided. The test device for testing a SRAM connects a resistor to a bit line on one side of a memory cell selected by a word line selection circuit and a bit line selection circuit of the SRAM. In a manner that a selected transistor and a resistor of the memory cell constitute a source follower circuit, the test device applies a voltage to each portion of the memory cell, applies an input voltage to a gate of the transistor constituting the source follower circuit, and inputs an output voltage outputted from a source of the transistor constituting the source follower circuit.

8 Claims, 7 Drawing Sheets

|  | PD3:WL | PD4:BL | PD5:Psd | PD6:Nsd | PD7:BLb |
|---|---|---|---|---|---|
|  | Vwl | Vbl | Vpsd | Vnsd | Vblb |
| pull up transistor | >Vvdd | Vin | Vgnd | Vin | Vvdd |
| pull down transistor | >Vvdd | Vin | Vin | Vvdd | Vgnd |
| pass gate transistor | Vin | Vin | Vvdd | Vvdd | Vgnd | characteristics of SF of PMOS characteristics of SF of NMOS

TEST DEVICE AND TEST METHOD OF SEMICONDUCTOR STORAGE DEVICE

CROSS-REFERENCE TO RELATED APPLICATION

This application claims the priority benefit of Japan application serial no. 2019-051018, filed on Mar. 19, 2019. The entirety of the above-mentioned patent application is hereby incorporated by reference herein and made a part of this specification.

BACKGROUND

Technical Field

The disclosure relates to a test of a semiconductor storage device, and particularly to a test of a static random access memory (SRAM).

Description of Related Art

As a high-speed memory capable of random reading and writing, the SRAM is widely used in high-speed cache memories, etc. The test method of the SRAM includes, for example, the following method. A test mode is written into the SRAM and it is determined whether the test mode may be correctly read therefrom. In addition, in the method using the test mode, failure of the transistor constituting the memory cell cannot be detected. Therefore, the test method of Patent Document 1 (Japanese Laid-Open No. 2011-181142) discharges a pair of bit lines connected to the memory cell. Then, the bit line on one side is set to a set voltage and the bit line on the other side is set to a floating state. Then, a word line is set to a voltage higher than the set voltage, such that small defects in a p-channel metal oxide semiconductor (PMOS) load transistor may be detected.

SUMMARY

In order to improve the yield of a static random access memory (SRAM) through a good process, it is required to measure a huge amount of statistical data of transistor characteristics. However, a memory cell of the SRAM includes a cross-coupled latch circuit of a complementary metal oxide semiconductor (CMOS) inverter and an output of the latch circuit is fully swung to either one of a power supply voltage level or a ground (GND) level. Therefore, the issue of being unable to obtain an analog output which represents the transistor characteristics of the memory cell is present.

The disclosure aims to solve such a conventional issue and the objective of the disclosure is to provide a test device and a test method capable of measuring characteristics of respective transistors constituting a memory cell.

The test device of the disclosure is for testing the following semiconductor storage devices including a memory cell array having a plurality of memory cells, wherein each memory cell includes a CMOS-type latch circuit and a pair of n-type access transistors, each gate of the pair of access transistors is connected to a word line, each terminal on one side is respectively connected to a pair of bit lines, and each terminal on the other side is respectively connected to a first connection node and a second of the latch circuit; a word line selection circuit for selecting the word line according to a row address; and a bit line selection circuit for selecting a pair of bit lines according to a column address. The test device includes a connecting component for connecting a resistor to a bit line on one side of a memory cell selected by the word line selection circuit and the bit line selection circuit; a applying component for respectively applying a voltage, in a manner that a selected transistor and the resistor of the memory cell constitute a source follower circuit, to a selected word line, the resistor, a first terminal and a first substrate terminal on the S/D side of a p-type transistor of the latch circuit, and a second terminal and a second substrate terminal on the S/D side of an n-type transistor; an input voltage applying component for applying an input voltage to a gate of the transistor constituting the source follower circuit; and an output voltage inputting component for inputting an output voltage outputted from a source of the transistor constituting the source follower circuit.

In a certain embodiment, when the selected transistor is the p-type transistor of the latch circuit, the applying component applies a voltage higher than a power supply voltage to the selected word line, applies the power supply voltage to the bit line on the side connected to the resistor, applies a GND voltage to the first terminal, applies the input voltage to the second terminal, applies the power supply voltage to the first substrate terminal, and applies the GND voltage to the second substrate terminal. In a certain embodiment, when the selected transistor is the n-type transistor of the latch circuit, the applying component applies a voltage higher than the power supply voltage to the word line, applies the GND voltage to the resistor, applies the input voltage to the first terminal, applies the power supply voltage to the second terminal, applies the power supply voltage to the first substrate terminal, and applies the GND voltage to the second substrate terminal. In a certain embodiment, when the selected transistor is the access transistor, the applying component applies the GND voltage to the resistor, applies the power supply voltage to the bit line, the first terminal, the second terminal, and the first substrate terminal on the other side, applies the GND voltage to the second substrate terminal. In a certain embodiment, the input voltage is a voltage which changes between the GND voltage and the power supply voltage. In a certain embodiment, the test device further includes a component for supplying the row address and the column address for selecting the memory cell to the word line selection circuit and the bit line selection circuit.

The test method of the disclosure includes the following steps. A memory cell is selected by a word line selection circuit and a bit line selection circuit. A resistor is connected to a bit line on one side of the selected memory cell. A voltage is respectively applied, in a manner that a selected transistor and the resistor of the memory cell constitute a source follower circuit, to a selected word line, the resistor, a first terminal and a first substrate terminal on the S/D side of a p-type transistor of the latch circuit, and a second terminal and a second substrate terminal on the S/D side of an n-type transistor. An input voltage is applied to a gate of the transistor constituting the source follower circuit. An output voltage outputted from a source of the transistor constituting the source follower circuit is inputted.

In a certain embodiment, the test method further includes the following step in order to select the memory cell. A row address and a column address are supplied to the word line selection circuit and the bit line selection circuit.

According to the disclosure, tests may be performed on respective transistors constituting the memory cell.

To make the aforementioned and other features of the disclosure more comprehensible, several embodiments accompanied with drawings are described in detail as follows.

DETAILED DESCRIPTION OF DISCLOSED EMBODIMENTS

Figure 1A:
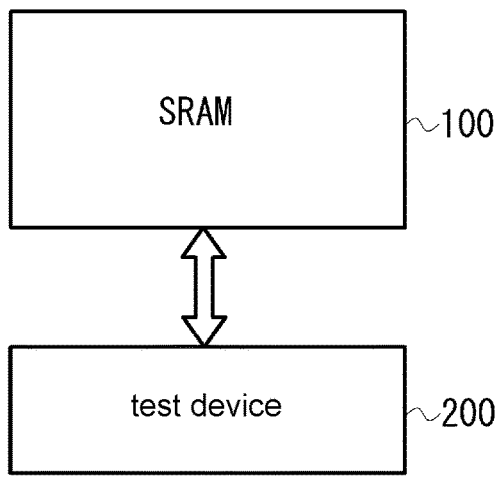
FIG. 1(A) and FIG. 1(B) are diagrams illustrating structural examples of a test device of a static random access memory (SRAM) according to an embodiment of the disclosure.
Figure 1B:
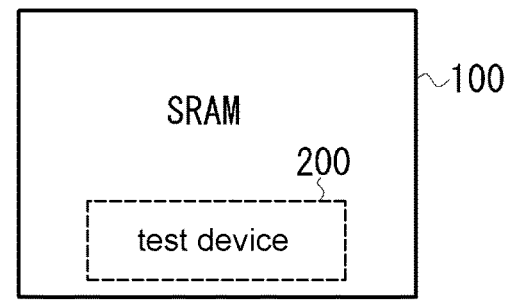

FIG. 1(A) and FIG. 1(B) are diagrams illustrating a test device of a static random access memory (SRAM) according to an embodiment of the disclosure. In the form shown in FIG. 1 (A), a test device 200 is electrically connected to an outside of a SRAM 100. The test device 200 applies a signal or a voltage required during testing to the SRAM 100 to perform a desired test of the SRAM 100. In addition, as shown in FIG. 1(B), the test device 200 may also be installed inside the SRAM 100. In this case, for example, when a test signal is applied to an external terminal of the SRAM 100, the test device 200 starts to operate.

Figure 2:
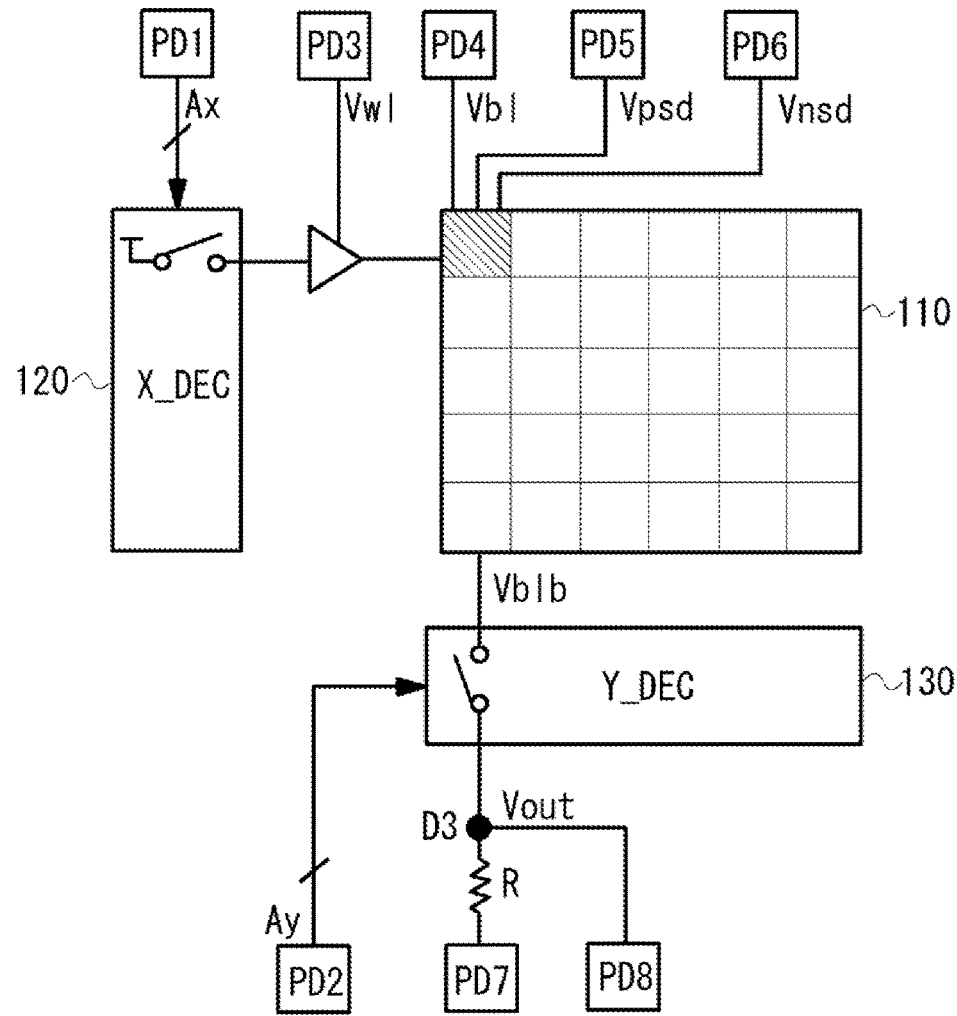
FIG. 2 is a diagram illustrating a test method of a SRAM according to an embodiment of the disclosure.

As shown in FIG. 2, the SRAM 100 includes a memory cell array 110 formed by a plurality of memory cells arranged in rows and columns, a row decoder (X_DEC) 120 for selecting a word line according to a row address, and a column decoder (Y_DEC) 130 for selecting a pair of bit lines according to a column address. Although not shown here, the SRAM 100 also includes a differential read amplifier, a write circuit, etc.

Figures 3A, 3B:
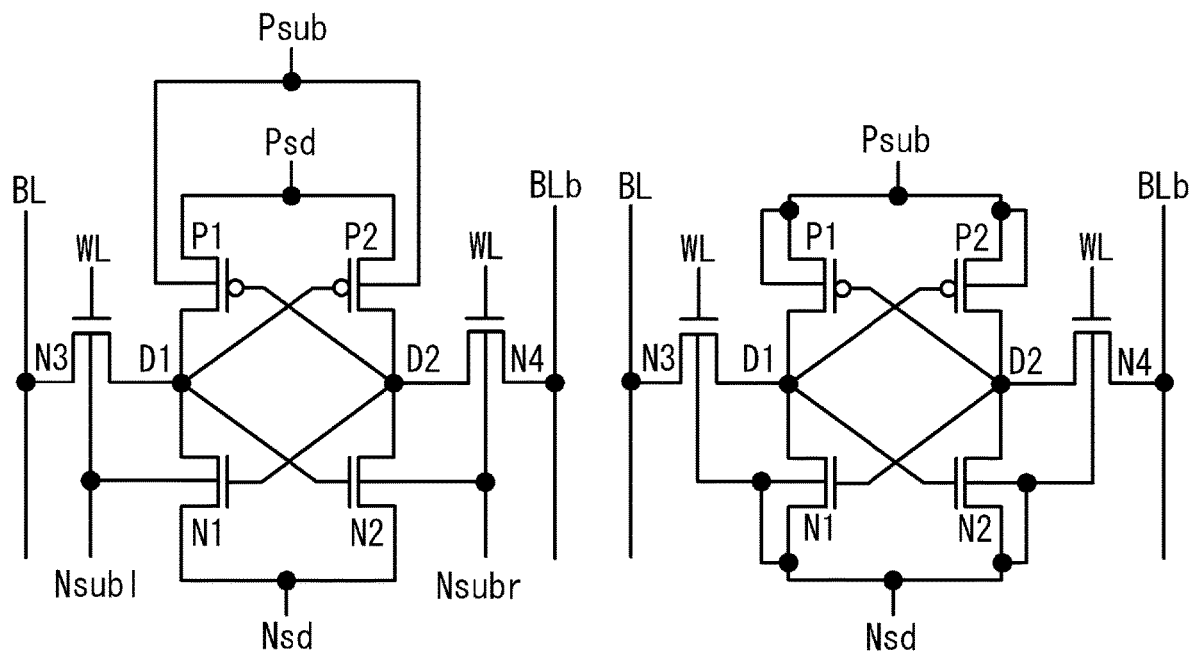
FIG. 3(A) is a diagram illustrating a structure of a memory cell of an SRAM according to the embodiment of the disclosure and FIG. 3(B) is a diagram illustrating a structure of a memory cell of a conventional SRAM.

FIG. 3(A) shows a structure of a memory cell of an SRAM. As shown in the drawing, the memory cell includes six transistors including a complementary metal oxide semiconductor (CMOS) inverter including a p-type pull up transistor P1 and an n-type pull down transistor N1, a CMOS inverter including a p-type pull up transistor P2 and an n-type pull down transistor N2, and a pair of n-type access transistor (pass gate transistor) N3 and access transistor N4. A pair of cross-coupled CMOS inverters constitute a latch circuit. A connection node D1 and a connection node D2 of the latch circuit are respectively connected to the S/D terminal on one side of the access transistor N3 and the access transistor N4. The gates of the access transistor N3 and the access transistor N4 are connected to a word line WL and the S/D terminal on the other side is connected to a pair of bit line BL and bit line BLb (BL).

In addition, in the memory cell of the embodiment, the S/D on one side of the pull up transistor P1 and the pull up transistor P2 is connected to a terminal Psd to form the n-well or the n-substrate of the transistor P1 or the transistor P2 to be connected to a substrate terminal Psub. The S/D on one side of the pull down transistor N1 and the pull down transistor N2 is connected to a terminal Nsd to form the p-well or the p-substrate of the transistor N1 to be connected to a substrate terminal Nsubr to form the p-well or the p-substrate of the transistor N2 to be connected to a substrate terminal Nsub1. In addition, the memory cell shown in FIG. 3 (B) is conventional structure. The wells or substrates of the transistor P1 and the transistor P2 are connected to the common substrate terminal Psub, and the wells or substrates of the transistor N1 and the transistor N2 are connected to a common substrate terminal Nsub.

In the following descriptions, the voltage applied to the word line WL is referred to as "Vw1", the voltage applied to the bit line BL and the bit line BLb is referred to as "Vb1" and "Vb1b", the voltage applied to the terminal Psd and the terminal Nsd on the S/D side is referred to as "Vpsd" and "Vnsd", the voltage applied to the substrate terminal Psub is referred to as "Vpsub", and the voltage applied to the substrate terminal Nsubr and the substrate terminal Nsub1 is referred to as "Vnsubr" and "Vnsubr1".

Figure 4:
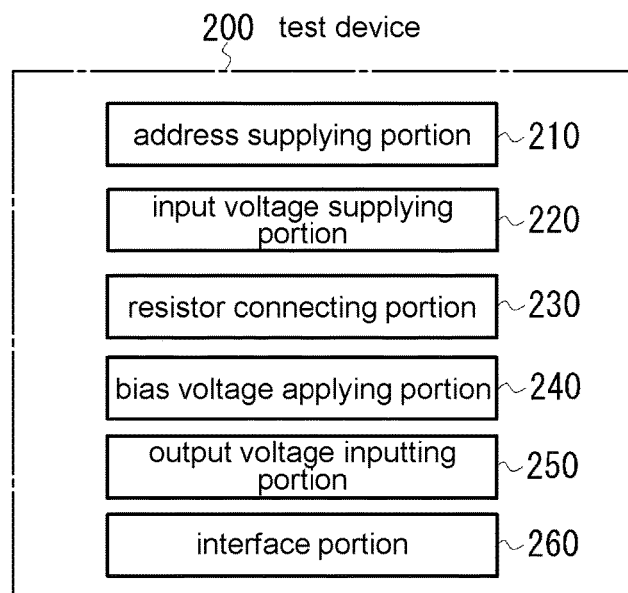
FIG. 4 is a block diagram illustrating a functional structure of a test device according to an embodiment of the disclosure.

FIG. 4 shows a functional structure of a test device 200 of the embodiment. As shown in the drawing, the test device 200 includes an address supplying portion 210 for supplying address information in order to select a memory cell as a test subject; an input voltage applying portion 220 for applying an input voltage to a gate of a selected transistor of the selected memory cell; a resistor connecting portion 230 for electrically connecting a resistor to a bit line of the selected memory cell; a bias voltage applying portion 240 for applying a bias voltage, in such a manner that the selected transistor and the resistor of the memory cell constitute a source follower circuit, to each portion of the memory cell; an output voltage inputting portion 250 for inputting an output voltage outputted from a source of the selected transistor; and an interface portion 260 for performing electrical connection between each portion of the test device 200 and the SRAM 100.

The address supplying portion 210 supplies a row address Ax and a column address Ay of the memory cell for selecting the test subject to supply to the SRAM 100. As shown in FIG. 2, the interface portion 260 includes an inner portion pad PD1 connected to the input of the row decoder 120 and an inner portion pad PD2 connected to the input of the column decoder 130. The row address Ax and column address Ay supplied from the address supplying portion 210 are applied to the inner portion pad PD1 and the inner portion pad PD2.

The row decoder 120 decodes the received row address Ax and selects the word line WL of the memory cell array 110. The column decoder 130 decodes the received column address Ay and selects the pair of bit line BL and bit line BLb of the memory cell array 110. Therefore, the memory cell on the memory cell array 110 is selected. The shaded part of FIG. 2 shows the selected memory cell. For ease of explanation, in the drawings, one inner portion pad PD1 and one inner portion pad PD2 are respectively shown, but the row address Ax and the column address Ay are multiple. When the row address Ax and the column address Ay are inputted side by side, the inner portion pad PD1 and the inner portion pad PD2 may be the number corresponding to the number of addresses.

The input voltage supplying portion 220 supplies an input voltage Vin to the gate of the transistor of the test subject in the selected memory cell. As shown in FIG. 2, the interface portion 260 includes an inner portion pad PD3 connected to the selected word line WL, an inner portion pad PD4 connected to the bit line BL of the selected memory cell, an inner portion pad PD5 connected to the terminal Psd on the S/D side of the pull up transistor of the selected memory cell, and an inner portion pad PD6 connected to the terminal Nsd on the S/D side of the pull down transistor of the selected memory cell. The interface portion 260 applies the input voltage supplied from the input voltage supplying portion 220 to selected inner portion pads in the inner portion pad PD3 to the inner portion pad PD6. The input voltage Vin is a signal continuously or discretely changing between the GND voltage (Vgnd) and the power supply voltage Vvdd.

The resistor connecting portion 230 connects the resistor R to the bit line BLb of the selected memory cell. The interface portion 260 includes the resistor R connected to the bit line BLb of the selected memory cell and an inner portion pad PD7 connected to the resistor R.

Figures 5, 6:
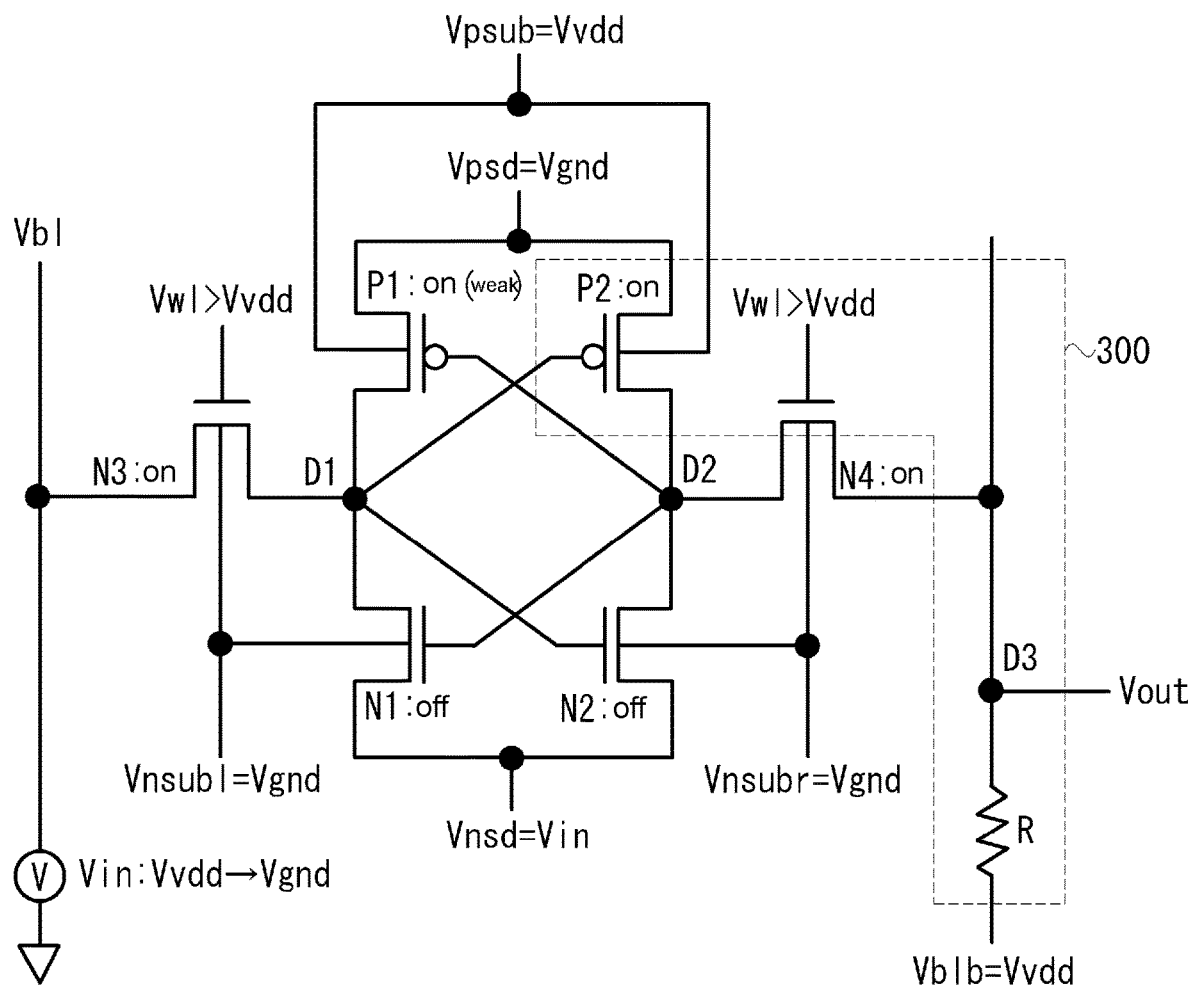
FIG. 5 is a table illustrating voltages of each portion applied by a bias voltage supplying component according to an embodiment of the disclosure.
FIG. 6 is a diagram illustrating bias voltages of each portion when testing a pull up transistor according to the embodiment of the disclosure.

The bias voltage applying portion 240 applies a bias voltage, in a manner that the transistor and the resistor R of the selected memory cell constitute the source follower circuit, to each portion of the selected memory cell. The table in FIG. 5 shows voltages generated by the bias voltage applying portion 240. The interface portion 260 applies the generated voltages to the inner portion pad PD3, the inner portion pad PD4, the inner portion pad PD5, the inner portion pad PD6, and the inner portion pad PD7. Furthermore, in all transistor tests, the power supply voltage Vvdd as the substrate voltage Vpsub is applied to the substrate terminal Psub of the pull up transistor and the GND voltage (Vgnd) as the substrate voltage Vnsub is applied to the substrate terminal Nsub of the pull down transistor.

The output voltage inputting portion 250 inputs the output voltage Vout outputted from the source of the transistor as the test subject of the selected memory cell. As shown in FIG. 2, the interface portion 260 includes an inner portion pad PD8 connected to an output node D3 formed between the selected transistor and the resistor R. The output voltage inputting portion 250 inputs the output voltage Vout via the inner portion pad PD8.

Next, a specific test example using the test device of the embodiment will be described. FIG. 6 shows the conditions of the bias voltages applied to each portion when testing the pull up transistor P2 of the memory cell. A voltage higher than the power supply voltage Vvdd is applied to the selected word line WL. The access transistor N3 and the access transistor N4 are strongly turned on. For example, as shown in FIG. 2, the inner portion pad PD3 supplies the high voltage to a driving circuit driving the word line WL. The input voltage Vin is applied to the bit line BL. The input voltage Vin changes from the power supply voltage Vvdd towards the Vgnd. The power supply voltage Vvdd is applied as the substrate voltage Vpsub of the pull up transistor P1 and the pull up transistor P2, the Vgnd is applied as the terminal voltage Vpsd on the S/D side, the Vgnd is applied as the substrate voltage Vnsub of the pull down transistor, and the input voltage Vin is applied as the terminal voltage Vnsd on the S/D side. The power supply voltage Vvdd is applied to the resistor R connected to the bit line BLb via the inner portion pad PD7. The output voltage Vout is outputted from the output node D3. By applying such a bias voltage, a source follower circuit 300 including the pull up transistor P2 and the resistor R is formed in the memory cell.

In the source follower circuit 300, the output voltage Vout outputted from the source of the pull up transistor P2 changes in a manner of following the input voltage Vin inputted to the gate, and the amplification factor thereof is below 1. The access transistor N3 and the access transistor N4 are strongly turned on. The voltage of the input voltage Vin is hardly affected by the access transistor N3 and is inputted to the gate of the pull up transistor P2. Similarly, the voltage of the connection node D2 of the pull up transistor P2 is hardly affected by the access transistor N4 and is outputted to the output node D3. In addition, the input voltage Vin is applied to the terminals on the S/D side of the pull down transistor N1 and the pull down transistor N2. Therefore, the transistor N1 and the transistor N2 are turned off (Vgs=0), and the pull down transistor N1 and the pull down transistor N2 are isolated from the connection node D1 and the connection node D2. As such, the access transistor N3, the access transistor N4, the pull down transistor N1, and the pull down transistor N2 do not actually affect the operation of the source follower circuit 300.

On the other hand, the power supply voltage Vvdd as the substrate voltage Vpsub and the Vgnd as the terminal voltage Vpsd on the S/D side are applied to the pull up transistor P2, so that the threshold value is adjusted by the substrate bias effect thereof. When the input voltage Vin has been inputted to the gate, the pull up transistor P2 is turned on. In addition, the p-channel metal oxide semiconductor (PMOS) source follower circuit has the function of detecting the minimum voltage. However, the voltage of the connection node D2 is higher than the voltage of the connection node D1 and the pull up transistor P1 is turned on in a weak state, so the transistor P1 hardly affects the output voltage Vout.

Figure 7A:
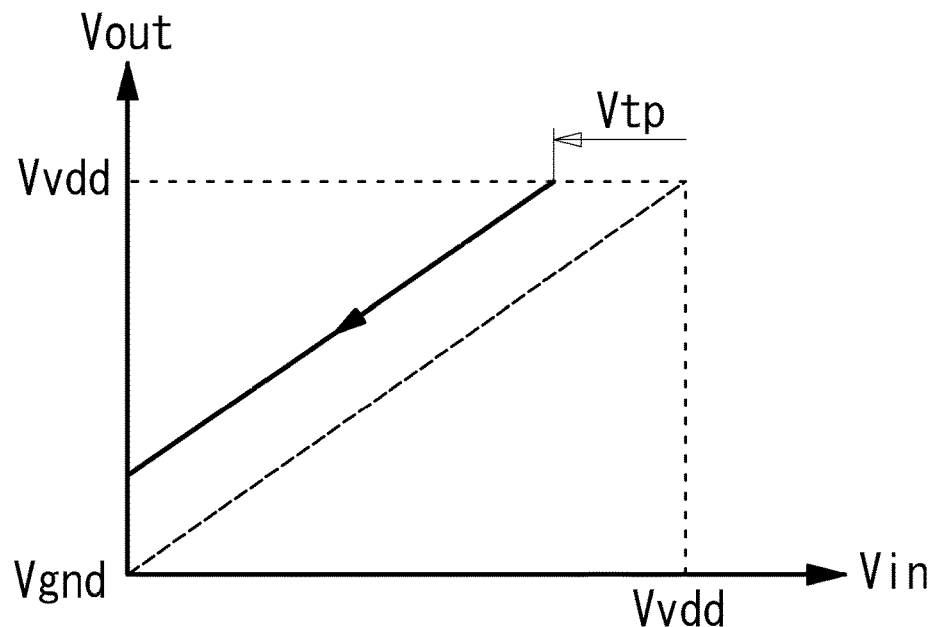
FIG. 7(A) is a diagram illustrating characteristics of a source follower of a p-channel metal oxide semiconductor (PMOS) transistor and FIG. 7(B) is a diagram illustrating characteristics of a source follower of an n-channel metal oxide semiconductor (NMOS) transistor.

FIG. 7(A) shows the characteristics of the source follower circuit of the PMOS transistor. If the input voltage Vin indicated by the dotted lines changes from the power supply voltage Vvdd towards the Vgnd, the output voltage Vout indicated by the solid lines changes, in a manner following the same, from the power supply voltage Vvdd towards the Vgnd. The difference between the input voltage Vin and the output voltage Vout becomes a threshold value Vtp of the PMOS transistor. If there is no abnormality in the pull up transistor P2, as shown in FIG. 7(A), the output voltage Vout follows the input voltage Vin. However, if there is an abnormality in the transistor P2, the output voltage Vout does not follow the input voltage Vin. The test device 200 monitors the output voltage Vout inputted from the output voltage inputting portion 250. When a waveform of the output voltage not following the input voltage Vin appears, the test device 200 determines that the pull up transistor P2 is abnormal.

Figure 8:
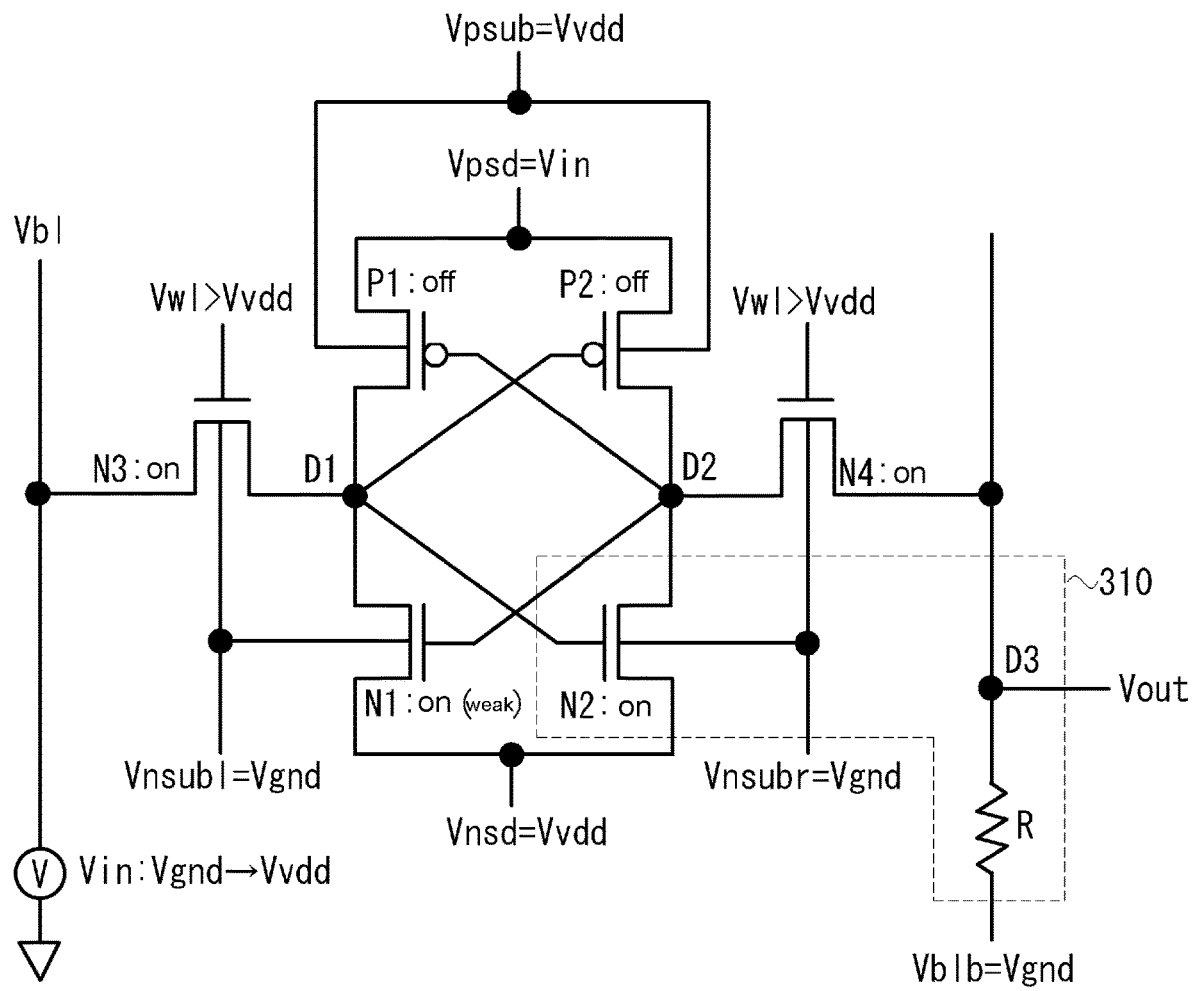
FIG. 8 is a diagram illustrating bias voltages of each portion when testing a pull down transistor according to the embodiment of the disclosure.

Next, FIG. 8 shows the conditions of the bias voltages applied to each portion when testing the pull down transistor N2 of the memory cell. A voltage higher than the power supply voltage Vvdd is applied to the selected word line WL. The access transistor N3 and the access transistor N4 are strongly turned on. The input voltage Vin is applied to the bit line BL. The input voltage Vin changes from the Vgnd towards the power supply voltage Vvdd. The power supply voltage Vvdd is applied as the substrate voltage Vpsub of the pull up transistor P1 and the pull up transistor P2, the input voltage Vin is applied as the terminal voltage Vpsd on the S/D side, the Vgnd is applied as the substrate voltage Vnsub of the pull down transistor, and the power supply voltage Vvdd is applied as the terminal voltage Vnsd on the S/D side. The Vgnd is applied to the resistor R connected to the bit line BLb via the inner portion pad PD7. The output voltage Vout is outputted from the output node D3. By applying such a bias voltage, a source follower circuit 310 including the pull down transistor N2 and the resistor R is formed in the memory cell.

As with the pull up transistors, the access transistor N3 and the access transistor N4 are strongly turned on. The input voltage Vin is hardly affected by the access transistor N3 and is inputted to the gate of the pull down transistor N2. Similarly, the voltage of the connection node D2 of the pull down transistor N2 is hardly affected by the access transistor N4 and is outputted to the output node D3. In addition, the input voltage Vin is applied to the terminals on the S/D side of the pull up transistor P1 and the pull up transistor P2. Therefore, the transistor P1 and the transistor P2 are turned off (Vgs=0), and the pull up transistor P1 and the pull up transistor P2 are isolated from the connection node D1 and the connection node D2. As such, the access transistor N3, the access transistor N4, the pull up transistor P1, and the pull up transistor P2 do not actually affect the operation of the source follower circuit 310.

On the other hand, the Vgnd as the substrate voltage Vnsub and the power supply voltage Vvdd as the terminal voltage Vnsd on the S/D side are applied to the pull down transistor N2. Therefore, if the input voltage Vin becomes greater than a threshold value Vtn of the transistor N2, the transistor N2 is turned on. In addition, the source follower circuit of an n-channel metal oxide semiconductor (NMOS) transistor has the function of detecting the maximum voltage. However, the voltage of the connection node D2 is lower than the voltage of the connection node D1 and the pull down transistor N1 is turned on in a weak state, so the transistor N1 hardly affects the output voltage Vout.

Figure 7B:
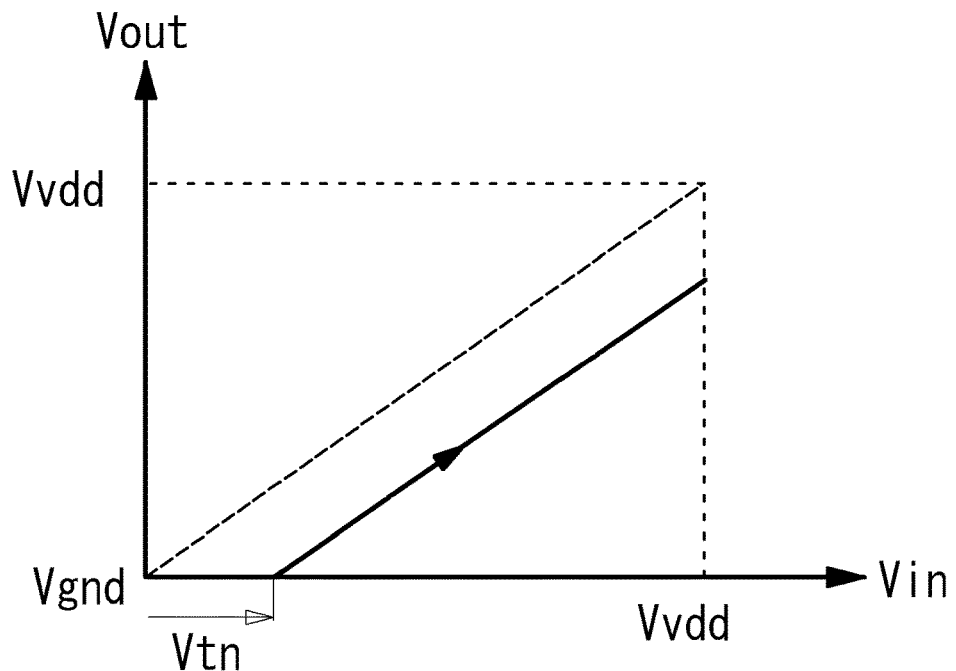

FIG. 7(B) shows the characteristics of the source follower circuit of the NMOS transistor. If the input voltage Vin indicated by the dotted lines changes from the Vgnd towards the power supply voltage Vvdd, the output voltage Vout indicated by the solid lines changes, in a manner following the same, from the Vgnd towards the power supply voltage Vvdd. The difference between the input voltage Vin and the output voltage Vout becomes the threshold value Vtn of the NMOS transistor. If there is no abnormality in the pull down transistor N2, as shown in FIG. 7 (B), the output voltage Vout follows the input voltage Vin. However, if there is an abnormality such as a defect in the transistor N2, the output voltage Vout does not follow the input voltage Vin. The test device 200 monitors the output voltage Vout inputted from the output voltage inputting portion 250. When a waveform of the output voltage not following the input voltage Vin appears, the test device 200 determines that the pull down transistor N2 is abnormal.

Figure 9:
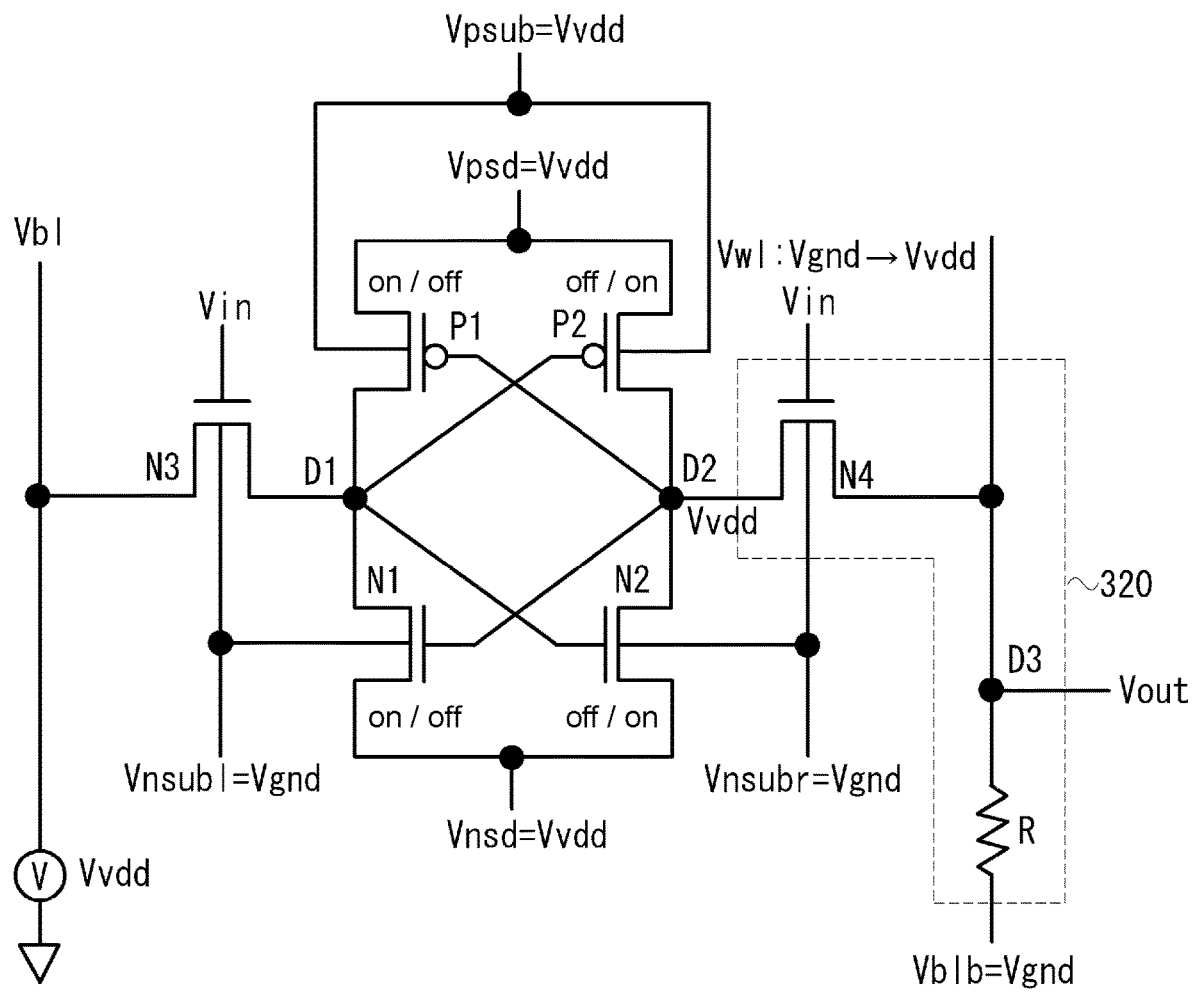
FIG. 9 is a diagram illustrating bias voltages of each portion when testing an access transistor according to the embodiment of the disclosure.

Next, FIG. 9 shows the conditions of the bias voltages applied to each portion when testing the access transistor N4 of the memory cell. The input voltage Vin is applied to the selected word line WL. The input voltage Vin changes from the Vgnd towards the power supply voltage Vvdd. The power supply voltage Vvdd is applied to the bit line BL. The power supply voltage Vvdd is applied as the substrate voltage Vpsub of the pull up transistor P1 and the pull up transistor P2, the power supply voltage Vvdd is applied as the terminal voltage Vpsd on the S/D side, the Vgnd is applied as the substrate voltage Vnsub of the pull down transistor, and the power supply voltage Vvdd is applied as the terminal voltage Vnsd on the S/D side. The Vgnd is applied to the resistor R connected to the bit line BLb via the inner portion pad PD7. The output voltage Vout is outputted from the output node D3. By applying such a bias voltage, a source follower circuit 320 including the access transistor N4 and the resistor R is formed in the memory cell.

If the input voltage Vin exceeds the threshold value Vtn, the access transistor N3 is turned on and the power supply voltage Vvdd of the bit line BL is supplied to the connection node D1. Corresponding to the voltage of the connection node D1, the pull up transistor P2 or the pull down transistor N2 is turned on, the connection node D2 is set to the power supply voltage Vvdd, and the connection node D1 is set to the Vvdd.

The source follower circuit of the NMOS transistor exhibits the characteristics of FIG. 7(B) as in the case of the pull-down transistor. The test device 200 monitors the output voltage Vout inputted from the output voltage inputting portion 250. When a waveform of the output voltage not following the input voltage Vin appears, the test device 200 determines that the access transistor N4 is abnormal.

In the description, an example of testing an analog output waveform of the pull up transistor P2, the pull down transistor N2, and the access transistor N4 is shown. However, the pull up transistor P1, the pull down transistor N1, and the access transistor N3 may also be tested by the same method. In this case, the relationship between the bit line BL and the bit line BLb is reversed, that is, the resistor R is connected to the bit line BL and the output voltage Vout is outputted therefrom.

Figure 10:
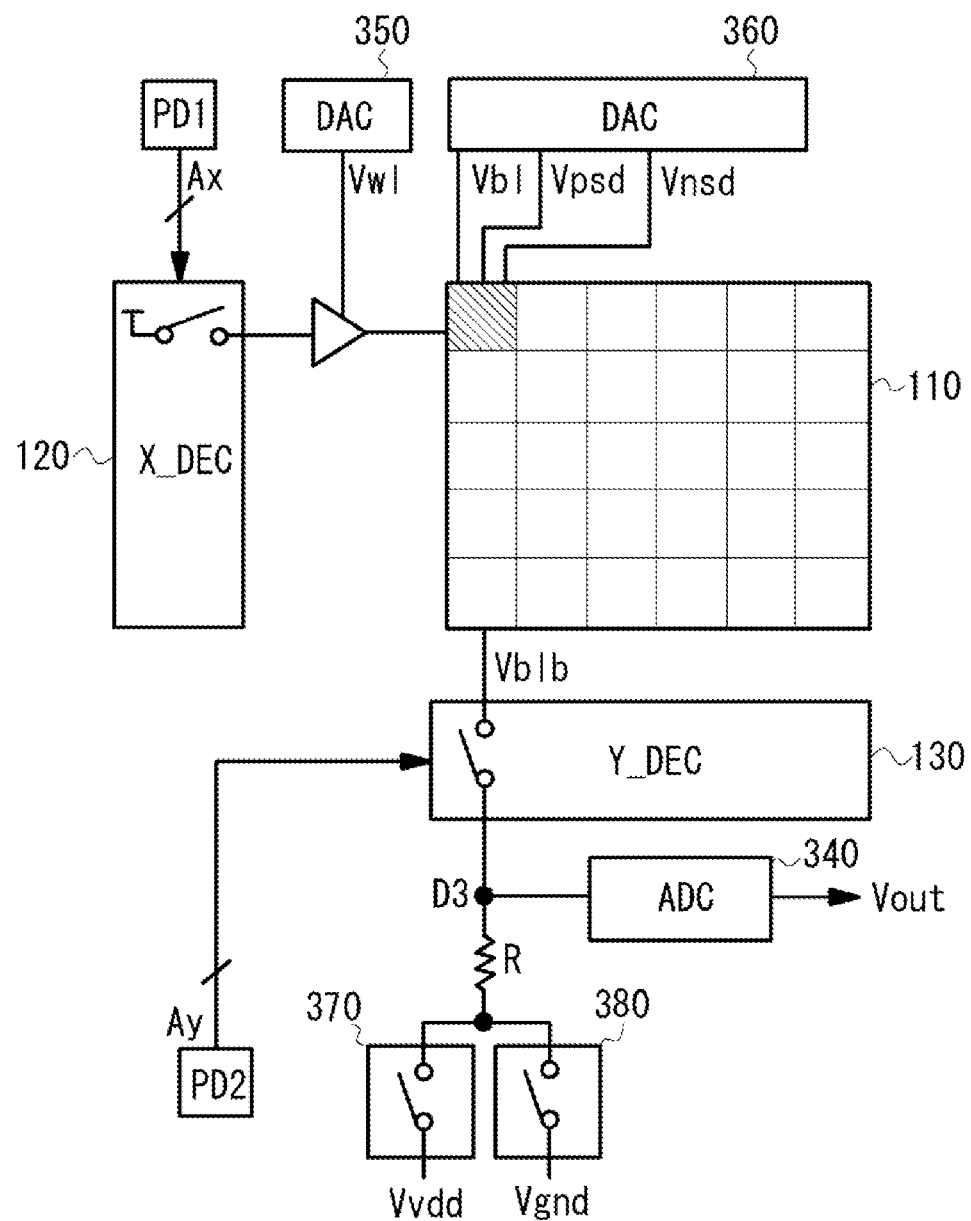
FIG. 10 is a diagram illustrating a test method of an SRAM according to another embodiment of the disclosure.

Next, another embodiment of the disclosure will be described with reference to FIG. 10. In the embodiment, a test using the test device 200 is controlled through a digital signal. The test device 200 of the embodiment uses a digital-to-analog converter (DAC) 350 and a DAC 360 to replace the inner portion pad PD3, the inner portion pad PD4, the inner portion pad PD5, and the inner portion pad PD5 shown in FIG. 2. The DAC 350 and the DAC 360 receive the digital signal formed by encoding the bias voltages shown in the table of FIG. 5 from a unshown control portion, convert the digital signal into an analog voltage, and apply analog voltages of the Vw1, the Vb1 (Vin), the Vpsd, and the Vnsd to each portion of the selected memory cell.

In addition, the test device 200 uses a switch 370 for supplying the power supply voltage Vvdd and a switch 380 for supplying the Vgnd to replace the inner portion pad PD7 connected to the resistor R. The control portion of the test device 200 controls the on and off of the switch 370 and the switch 380 in response to a transistor (for example, a pull up transistor, a pull down transistor, etc.) as the test subject, and applies the power supply voltage Vvdd or the Vgnd to the resistor R. Furthermore, an analog-to-digital converter (ADC) 340 is connected to the output node D3 to replace the inner portion pad PD8. The ADC 340 converts an analog output voltage outputted from the output node D3 into a digital output voltage and outputs towards the control portion. The control portion compares the digital value of the input voltage Vin with the digital value of the output voltage Vout and determines whether there is an abnormality in the transistor of the memory cell.

According to the embodiment, the DAC and ADC are used to switch the applied analog voltages, so that the number of inner portion pads can be reduced as shown in FIG. 2. In addition, the ADC or DAC can be implemented with a very small area as compared to the case of using inner portion pads.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test device for a semiconductor storage device, wherein the semiconductor storage device comprises:
    a memory cell array, having a plurality of memory cells, wherein a memory cell comprises a complementary metal oxide semiconductor type latch circuit and a pair of n-type access transistors, each gate of a pair of access transistors is connected to a word line, each terminal on one side is respectively connected to a pair of bit lines, and each terminal on the other side is respectively connected to a first connection node and a second connection node of a latch circuit;
    a word line selection circuit, configured to select a word line according to a row address; and
    a bit line selection circuit, configured to select a pair of bit lines according to a column address; the test device comprising:
    a connecting component, configured to connect a resistor to a bit line on one side of a memory cell selected by the word line selection circuit and the bit line selection circuit;
    an applying component, configured to apply a first voltage to the selected word line, apply a second voltage to the resistor, apply a third voltage to a first terminal on a source/drain side of a p-type transistor of the latch circuit, apply a fourth voltage to a first substrate terminal on the source/drain side of the p-type transistor of the latch circuit, apply a fifth voltage to a second terminal on a source/drain side of an n-type transistor and apply a sixth voltage to a second substrate terminal on the source/drain side of the n-type transistor, wherein the selected transistor and the resistor of the selected memory cell constitute a source follower circuit;
    an input voltage applying component, configured to apply an input voltage to a gate of the transistor constituting the source follower circuit; and
    an output voltage inputting component, configured to receive an output voltage outputted from a source of the transistor constituting the source follower circuit.

2. The test device according to claim 1, wherein
    the selected transistor is the p-type transistor of the latch circuit,
    the first voltage that is applied to the selected word line is a voltage higher than a power supply voltage,
    the second voltage is applied to the resistor is the power supply voltage,
    the third voltage that is applied to the first terminal is a ground voltage,
    the fifth voltage that is applied to the second terminal is the input voltage,
    the fourth voltage that is applied to the first substrate terminal is the power supply voltage, and
    the sixth voltage that is applied to the second substrate terminal is a ground voltage.

3. The test device according to claim 1, wherein
    the selected transistor is the n-type transistor of the latch circuit,
    the first voltage that is applied to the selected word line is a voltage higher than a power supply voltage,
    the second voltage is applied to the resistor is a ground voltage,
    the third voltage that is applied to the first terminal is the input voltage,
    the fifth voltage that is applied to the second terminal is the power supply voltage,
    the fourth voltage that is applied to the first substrate terminal is the power supply voltage, and
    the sixth voltage that is applied to the second substrate terminal is a ground voltage.

4. The test device according to claim 1, wherein when the selected transistor is an access transistor, the applying component is further configured to apply a ground voltage to the resistor, apply a power supply voltage to a bit line on the other side, the first terminal, the second terminal, and the first substrate terminal, and apply the ground voltage to the second substrate terminal.

5. The test device according to claim 1, wherein the input voltage is a voltage which changes between the ground voltage and the power supply voltage.

6. The test device according to claim 1, further comprising a component configured to supply the row address and the column address of a memory cell to the word line selection circuit and the bit line selection circuit.

7. A test method for a semiconductor storage device, wherein the semiconductor storage device comprises a memory cell array, having a plurality of memory cells, wherein a memory cell comprises a complementary metal oxide semiconductor type latch circuit and a pair of n-type access transistors, each gate of a pair of access transistors is connected to a word line, each terminal on one side is respectively connected to a pair of bit lines, and each terminal on the other side is respectively connected to a first connection node and a second connection node of a latch circuit; a word line selection circuit, for selecting a word line according to a row address; and a bit line selection circuit, for selecting a pair of bit lines according to a column address; the test method comprising:
    selecting a memory cell through the word line selection circuit and the bit line selection circuit;
    connecting a resistor to a bit line on one side of the selected memory cell;
    applying a first voltage to the selected word line, applying a second voltage to the resistor, applying a third voltage to a first terminal on a source/drain side of a p-type transistor of the latch circuit, applying a fourth voltage to a first substrate terminal on the source/drain side of the p-type transistor of the latch circuit, applying a fifth voltage to a second terminal on a source/drain side of an n-type transistor and applying a sixth voltage to a second substrate terminal on the source/drain side of the n-type transistor, wherein the selected transistor and the resistor of the selected memory cell constitute a source follower circuit;
    applying an input voltage to a gate of the transistor constituting the source follower circuit; and
    receiving an output voltage outputted from a source of the transistor constituting the source follower circuit.

8. The test method according to claim 7, further comprising the step for supplying the column address and the row address to the word line selection circuit and the bit line selection circuit in order to select a memory cell.

\* \* \* \* \*